(12) United States Patent
Byeon

(10) Patent No.: US 8,461,627 B2
(45) Date of Patent: Jun. 11, 2013

(54) STACK ARRAY STRUCTURE FOR A SEMICONDUCTOR MEMORY DEVICE

(75) Inventor: Dae-Seok Byeon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 817 days.

(21) Appl. No.: 12/635,769

(22) Filed: Dec. 11, 2009

(65) Prior Publication Data

US 2010/0148220 A1    Jun. 17, 2010

(30) Foreign Application Priority Data

Dec. 15, 2008    (KR) .................. 10-2008-0127015

(51) Int. Cl.
*H01L 27/088*    (2006.01)
(52) U.S. Cl.
USPC ..................................... 257/208; 257/E27.06
(58) Field of Classification Search
USPC .................. 257/208, E27.06, 315, 316, 317, 257/318, 319, 320, 321
See application file for complete search history.

(56) References Cited

U.S. PATENT DOCUMENTS 7,005,350 B2    2/2006    Walker et al.

FOREIGN PATENT DOCUMENTS

| KR | 1020030068776 A | 8/2003 |
|---|---|---|
| KR | 1020060098045 A | 9/2006 |
| KR | 1020070078453 A | 8/2007 |

*Primary Examiner* — Roy Potter
(74) *Attorney, Agent, or Firm* — Volentine & Whitt, PLLC

(57) ABSTRACT

In a stack array structure for a semiconductor memory device, a first semiconductor layer includes a plurality of first cell strings, and a second semiconductor including a plurality of second cell strings. Bit-line contact plugs are configured to couple a bit-line to two adjacent first cell strings aligned in series in a bit-line direction, and to further couple the bit-line to two adjacent second cell strings respectively located over the two adjacent first cell strings. Common source line contact plugs are configured to couple a common source line to the two adjacent first cell strings and the two adjacent second cell strings. Pocket p-well contact plugs are located at positions corresponding to a layout of the bit-line plugs and/or common source line plugs, and are configured to couple a pocket p-well line to the first semiconductor layer and the second semiconductor layer.

16 Claims, 9 Drawing Sheets

STACK ARRAY STRUCTURE FOR A SEMICONDUCTOR MEMORY DEVICE

CROSS-REFERENCE TO RELATED APPLICATION(S)

A claim of priority under 35 USC §119 is made to Korean Patent Application No. 2008-0127015, filed Dec. 15, 2008, in the Korean Intellectual Property Office (KIPO), the contents of which are incorporated herein in its entirety by reference.

BACKGROUND

Example embodiments relate to semiconductor memory devices, and more particularly, to stack array structures for semiconductor memory devices.

Semiconductor memory devices are generally classified as either volatile memory devices which lose stored data in the absence of applied power, or non-volatile memory devices which retain stored data when applied power is turned off or otherwise interrupted. The NAND flash memory device is widely used among the class of non-volatile memory devices. Generally, however, it is relatively difficult to increase the degree of integration of a NAND flash memory device. This is at least partly the result of channel length limitations of cell transistors and limitations relating to minimum sense currents in a NAND flash memory device.

SUMMARY

Example embodiments provide a stack array structure for a semiconductor memory device.

According to some example embodiments, a stack array structure for a semiconductor memory device is provided which includes a first semiconductor layer, a second semiconductor layer, a plurality of bit-line contact plugs, a plurality of common source line contact plugs, and a plurality of pocket p-well contact plugs. The first semiconductor layer includes a plurality of first cell strings which include first cell strings extending parallel to one another in a word-line direction and first cell strings aligned in series in a bit-line direction. The second semiconductor including a plurality of second cell strings which include second cell strings extending parallel to one another in a word-line direction and second cell strings aligned in series in a bit-line direction. The second semiconductor layer is located over the first semiconductor layer such that the second cell strings are located over the first cell strings. The plurality of bit-line contact plugs are configured to couple a bit-line to two adjacent first cell strings aligned in series in the bit-line direction, and to further couple the bit-line to two adjacent second cell strings respectively located over the two adjacent first cell strings. The bit-line contact plugs are arranged to define a bit-line plug layout over the plurality of first cells strings and the plurality of second cell strings. The plurality of common source line contact plugs are configured to couple a common source line to the two adjacent first cell strings and the two adjacent second cell strings. The plurality of pocket p-well contact plugs are located at positions corresponding to bit-line plug layout and are configured to couple a pocket p-well line to the first semiconductor layer and the second semiconductor layer.

According to some other example embodiments, a stack array structure for a semiconductor memory device is provided which includes a first semiconductor layer, a second semiconductor layer, a plurality of bit-line contact plugs, a plurality of common source line contact plugs, and a plurality of pocket p-well contact plugs. The first semiconductor layer includes a plurality of first cell strings which include first cell strings extending parallel to one another in a word-line direction and first cell strings aligned in series in a bit-line direction. The second semiconductor including a plurality of second cell strings which include second cell strings extending parallel to one another in a word-line direction and second cell strings aligned in series in a bit-line direction. The second semiconductor layer is located over the first semiconductor layer such that the second cell strings are located over the first cell strings. The plurality of bit-line contact plugs are configured to couple a bit-line to two adjacent first cell strings aligned in series in the bit-line direction, and to further couple the bit-line to two adjacent second cell strings respectively located over the two adjacent first cell string. The plurality of common source line contact plugs are configured to couple a common source line to the two adjacent first cell strings and the two adjacent second cell strings. The common source line contact plugs are arranged to define a common source line contact plug layout over the plurality of first cells strings and the plurality of second cell string. The plurality of pocket p-well contact plugs are located at positions corresponding to common source line contact plug layout and are configured to couple a pocket p-well line to the first semiconductor layer and the second semiconductor layer.

BRIEF DESCRIPTION OF THE DRAWINGS

Illustrative, non-limiting example embodiments will be more clearly understood from the detailed description that follows, with reference to the accompanying drawings.

DETAILED DESCRIPTION OF THE EMBODIMENTS

Figure 1:
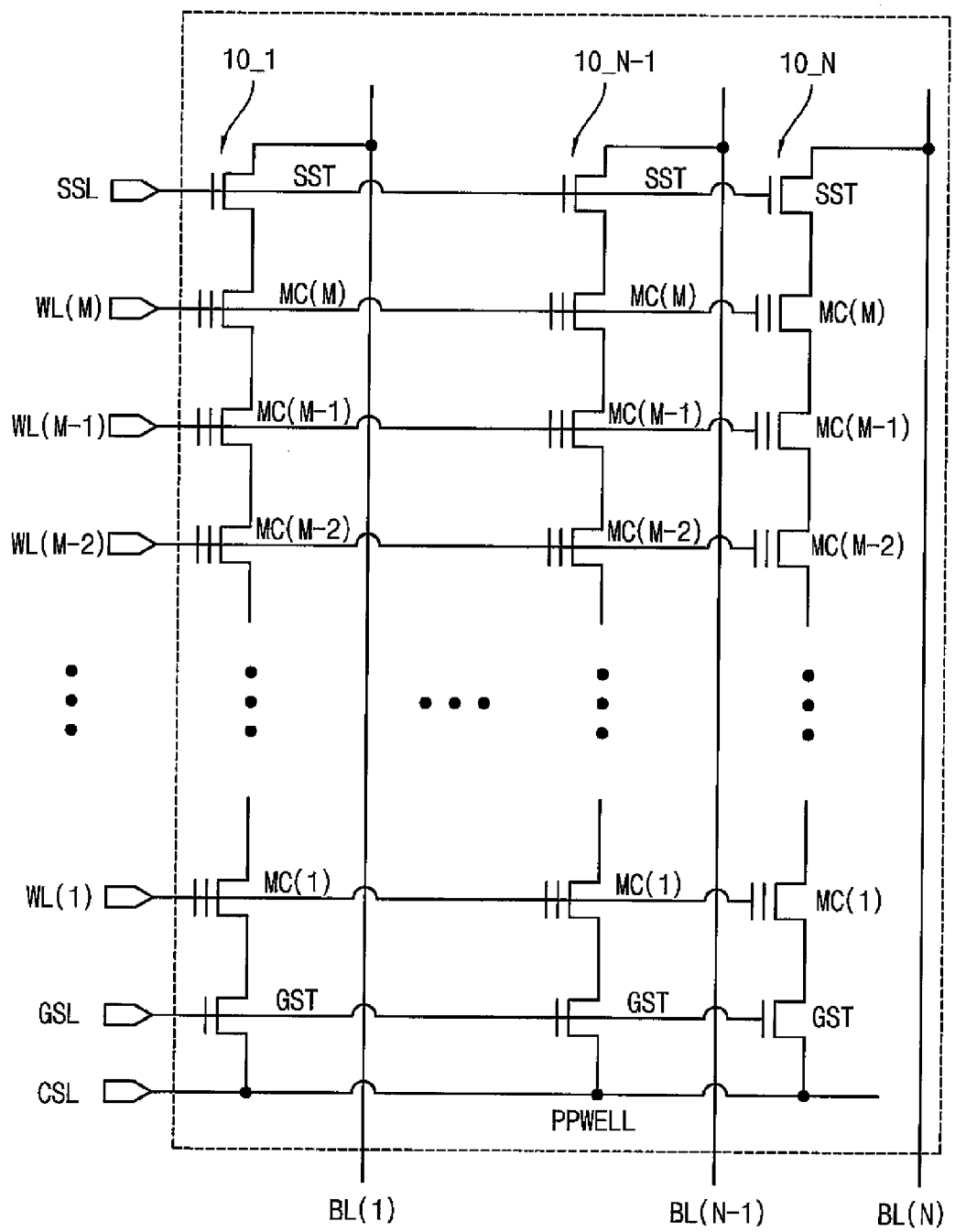
FIG. 1 is a circuit diagram illustrating an array structure for a NAND flash memory device.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating an example of an array structure for a NAND flash memory device.

In the example of FIG. 1, cell strings 10_1 through 10_N are formed on a pocket p-well region (PPWELL) in the array structure 100 of the NAND flash memory device. Bit-lines BL(1) through BL(N) are respectively coupled to the cell strings 10_1 through 10_N. Each of the cell strings 10_1 through 10_N includes a string selection transistor SST, a ground selection transistor GST, and memory cells MC(1) through MC(M) coupled in series between the string selection transistor SST and the ground selection transistor GST. The string selection transistor SST of this example includes a drain terminal coupled to one of the bit-lines BL(1) through BL(N), a gate terminal coupled to a string selection line SSL, and a source terminal coupled to the memory cell MC(M). The ground selection transistor GST of this example includes a source terminal coupled to a common source line CSL, a gate terminal coupled to a ground selection line GSL, and a drain terminal coupled to the memory cell MC(1). The memory cells MC(1) through MC(M) are coupled in series between the source terminal of the string selection transistor SST and the drain terminal of the ground selection transistor GST. Gates of the memory cells MC(1) through MC(M) are respectively coupled to word-lines WL(1) through WL(M). For example, the number of the memory cells MC(1) through MC(M) in each of the cell strings 10_1 through 10_N may be 16, 32, 64, and an so on.

Figure 2:
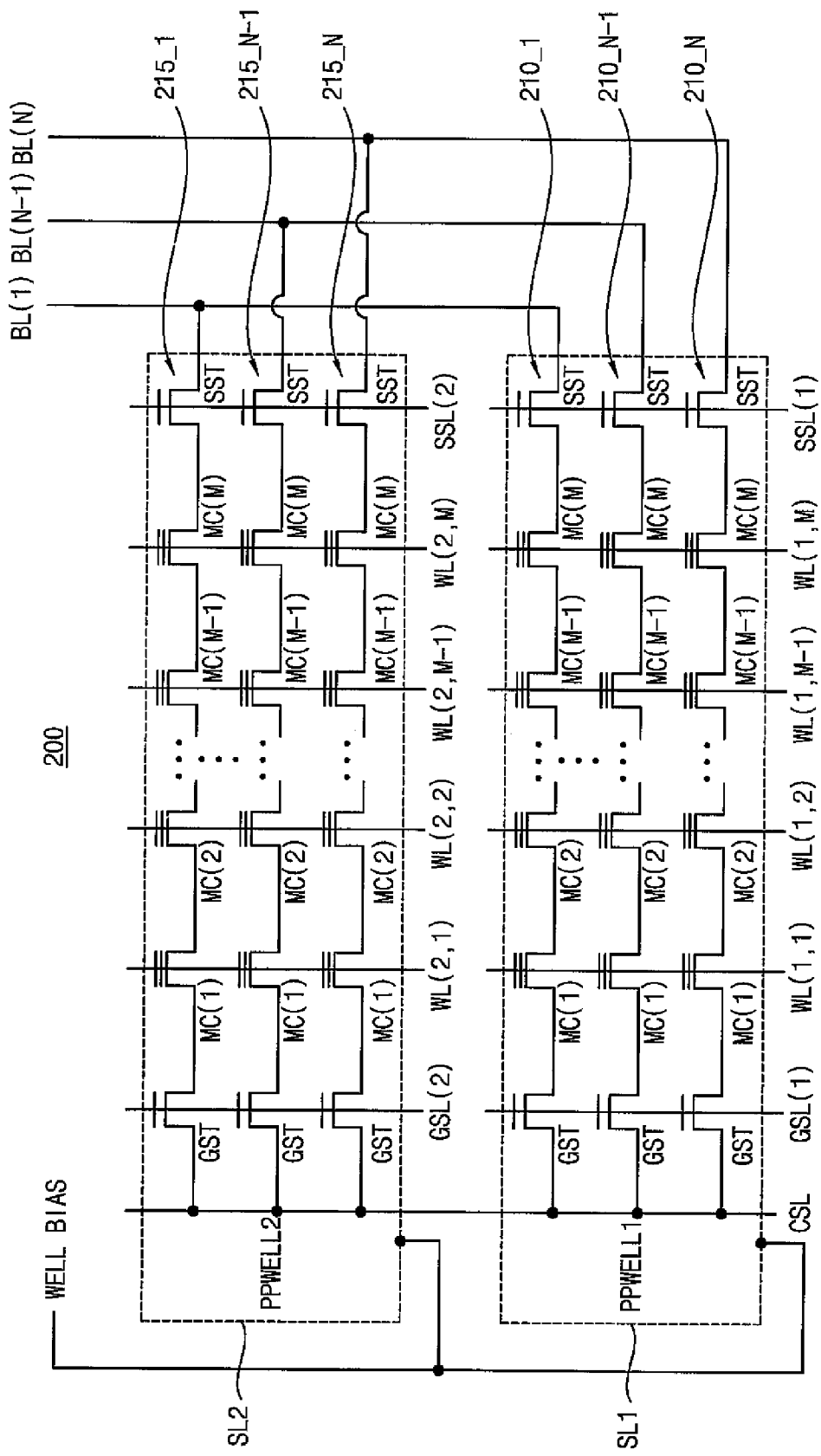
FIG. 2 is a circuit diagram illustrating a stack array structure for a NAND flash memory device.

FIG. 2 is a circuit diagram illustrating an example of a stack array structure for a NAND flash memory device.

In the example of FIG. 2, the stack array structure 200 of the NAND flash memory device includes a first semiconductor layer SL1 and a second semiconductor layer SL2. In the first semiconductor layer SL1, first cell strings 210_1 through 210_N are formed on a first pocket p-well region PPWELL1. In the second semiconductor layer SL2, second cell strings 215_1 through 215_N are formed on a second pocket p-well region PPWELL2. The number of semiconductor layers may be changed from the two illustrated in FIG. 2. Also, in the example of FIG. 2, a well bias voltage WELL BIAS is applied to the first pocket p-well region PPWELL1, and/or the second pocket p-well region PPWELL2 based on operations of the NAND flash memory device.

In the first semiconductor layer SL1, bit-lines BL(1) through BL(N) are respectively coupled to the first cell strings 210_1 through 210_N. Each of the first cell strings 210_1 through 210_N includes a string selection transistor SST, a ground selection transistor GST, and memory cells MC(1) through MC(M) coupled in series between the string selection transistor SST and the ground selection transistor GST. The string selection transistor SST of this example includes a drain terminal coupled to one of the bit-lines BL(1) through BL(N), a gate terminal coupled to a first string selection line SSL(1), and a source terminal coupled to the memory cell MC(M). The ground selection transistor GST of this example includes a source terminal coupled to a common source line CSL, a gate terminal coupled to a first ground selection line GSL(1), and a drain terminal coupled to the memory cell MC(1). The memory cells MC(1) through MC(M) are coupled in series between the source terminal of the string selection transistor SST and the drain terminal of the ground selection transistor GST. Gates of the memory cells MC(1) through MC(M) are respectively coupled to first word-lines WL(1,1) through WL(1,M).

In the second semiconductor layer SL2, bit-lines BL(1) through BL(N) are respectively coupled to the first cell strings 215_1 through 215_N. Each of the second cell strings 215_1 through 215_N includes a string selection transistor SST, a ground selection transistor GST, and memory cells MC(1) through MC(M) coupled in series between the string selection transistor SST and the ground selection transistor GST. The string selection transistor SST of this example includes a drain terminal coupled to one of the bit-lines BL(1) through BL(N), a gate terminal coupled to a second string selection line SSL(2), and a source terminal coupled to the memory cell MC(M). The ground selection transistor GST of this example includes a source terminal coupled to a common source line CSL, a gate terminal coupled to a second ground selection line GSL(2), and a drain terminal coupled to the memory cell MC(1). The memory cells MC(1) through MC(M) are coupled in series between the source terminal of the string selection transistor SST and the drain terminal of the ground selection transistor GST. Gates of the memory cells MC(1) through MC(M) are respectively coupled to second word-lines WL(2,1) through WL(2,M).

Figure 3:
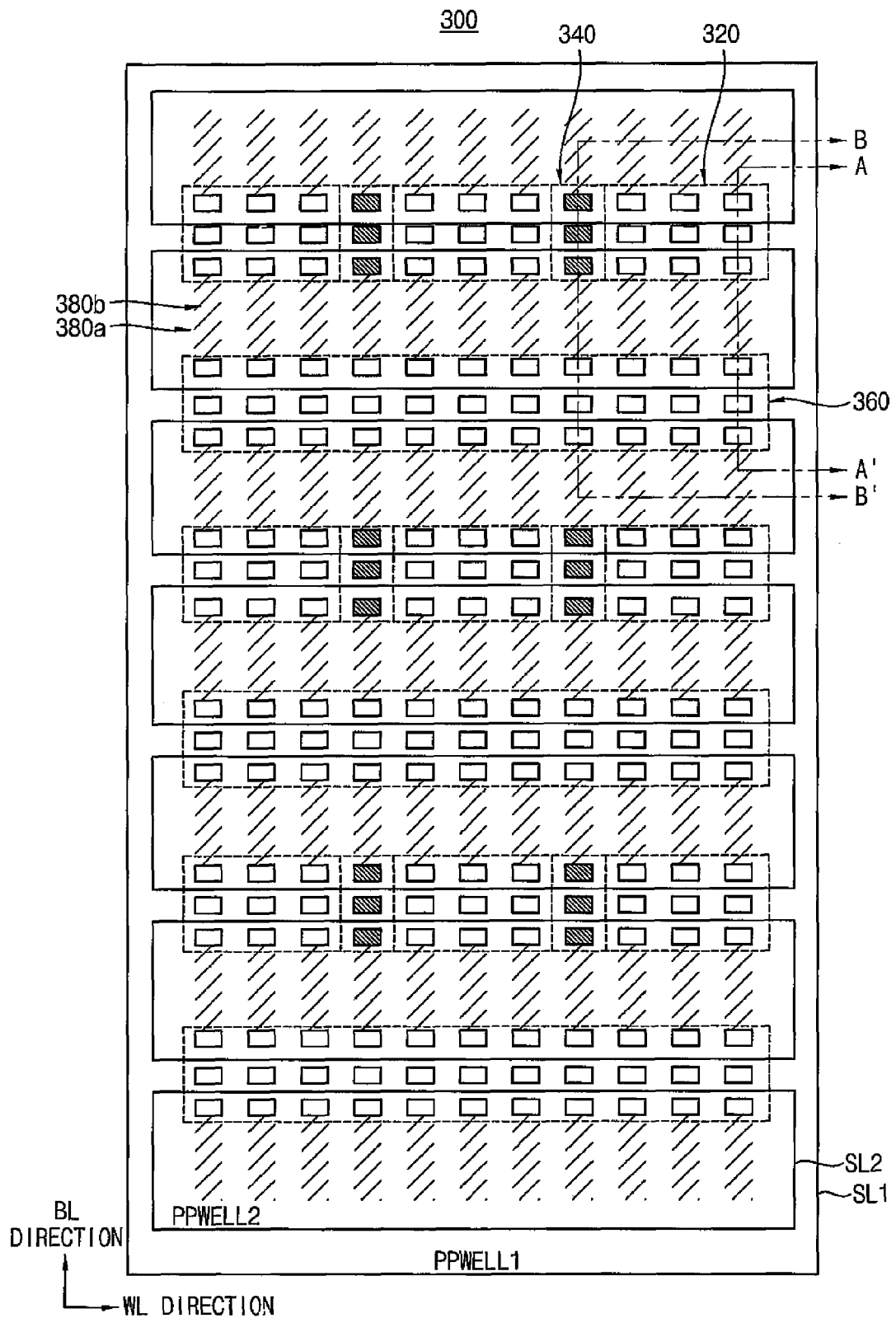
FIG. 3 is a diagram illustrating a stack array structure for a semiconductor memory device according to some example embodiments.

FIG. 3 is a diagram illustrating a stack array structure for a semiconductor memory device according to some example embodiments.

In the example of FIG. 3, the stack array structure 300 includes a first semiconductor layer SL1, a second semiconductor layer SL2, a plurality of bit-line contact plugs 320, a plurality of common source line contact plugs 360, and a plurality of pocket p-well contact plugs 340.

Figure 4:
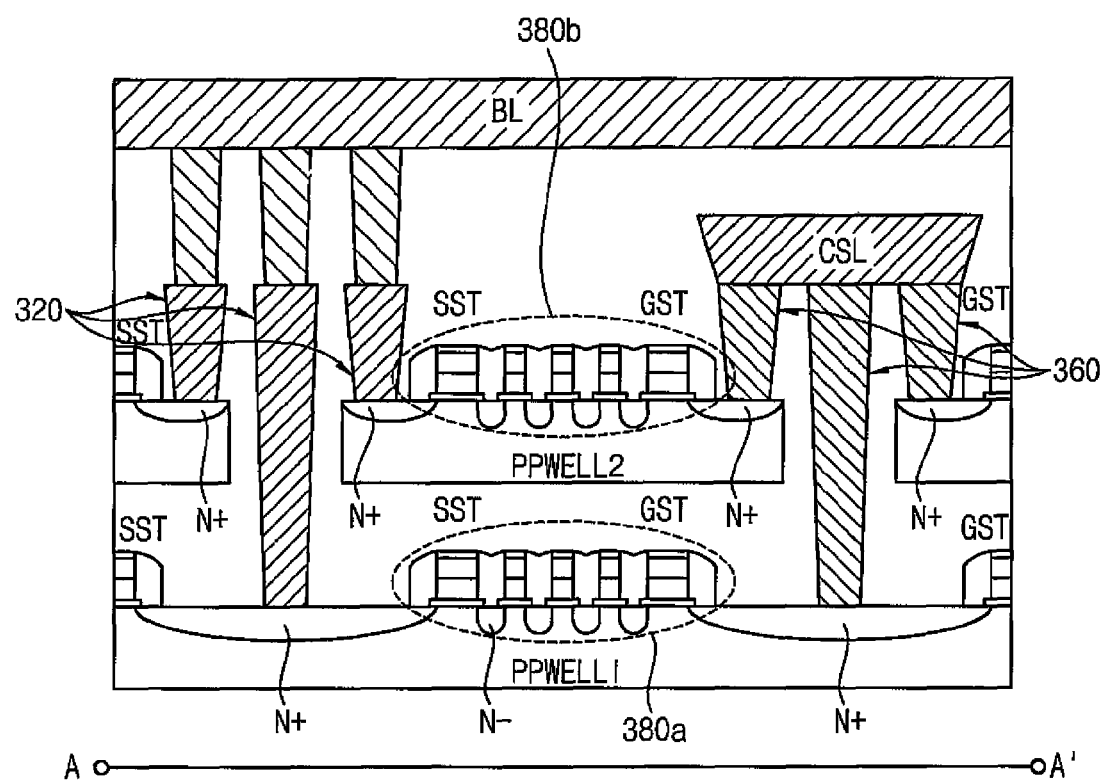
FIG. 4 is a cross-sectional view of the stack array structure of FIG. 3 taken along line A-A' of FIG. 3.
Figure 5:
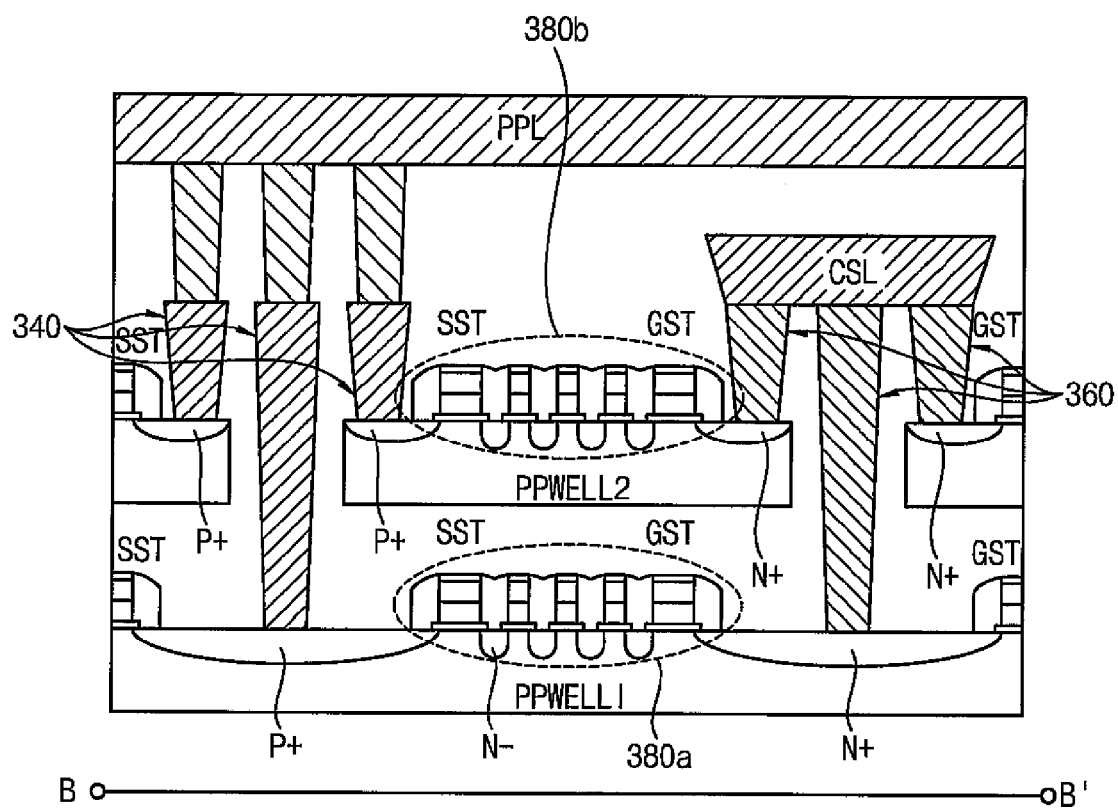
FIG. 5 is a cross-sectional view of the stack array structure of FIG. 3 taken along line B-B' of FIG. 3.

The first semiconductor layer SL1 includes a plurality of first cell strings 380a. The first cell strings 380a are arranged in series in a bit-line direction, and in parallel in a word-line direction. Adjacent pairs of the first cell strings 380a are symmetrical to each other. The second semiconductor layer SL2 includes a plurality of second cell strings 380b. The second cell strings 380b are arranged in a same manner as the first cell strings 380a. That is, the second cell strings 380b are also arranged in series in the bit-line direction, and in parallel in the word-line direction. Adjacent pairs of the second cell strings 380b are also symmetrical to each other. The second semiconductor layer SL2 is located over the first semiconductor layer SL1. In addition, the second cell strings 380b are located over the first cell strings 380a (as illustrated in FIG. 4 and FIG. 5, described later).

The bit-line contact plugs 320 couple a bit-line to two adjacent first cell strings 380a that are arranged in series in the bit-line direction, and to two adjacent second cell strings 380b that are arranged over the two adjacent first cell strings 380a. The bit-line (not shown in FIG. 3) is placed over the second cell strings 380b in the bit-line direction. The common source line contact plugs 360 couple a common source line to two adjacent first cell strings 380a that are arranged in series in the bit-line direction, and to two adjacent second cell strings 380b that are arranged over the two adjacent first cell strings 380a. The common source line (not shown in FIG. 3) is placed over the second cell strings 380b in the word-line direction. The pocket p-well contact plugs 340 couple a pocket p-well line to the first semiconductor layer SL1, and to the second semiconductor layer SL2. The pocket p-well contact plugs 340 are formed instead of at least one of the bit-line contact plugs 320 at corresponding positions of the layout defined by the bit-line contact plugs 320. The pocket p-well line (not shown in FIG. 3) is placed over the second cell strings 380b in the bit-line direction. However, the direction in which the pocket p-well line is placed over the second cell strings 380b in not limited thereto.

The adjacent pair of the first cell strings 380a that are formed on the first semiconductor layer SL1 are symmetrical in the word-line direction as well as in the bit-line direction. The adjacent pair of the second cell strings 380b that are formed on the second semiconductor layer SL2 are arranged in the same manner as the adjacent pair of the first cell strings 380a. That is, the adjacent pair of the second cell strings 380b are symmetrical in the word-line direction as well as in the bit-line direction. For example, two adjacent first cell strings 380a arranged in parallel are symmetrical to each other, and two adjacent first cell strings 380a arranged in series are also symmetrical to each other. Similarly, two adjacent second cell strings 380b arranged in parallel are symmetrical to each other, and two adjacent second cell strings 380b arranged in series are also symmetrical to each other.

The bit-line contact plugs 320 couple the bit-line to the two adjacent first cell strings 380a that are arranged in series in the bit-line direction, and to the two adjacent second cell strings 380b that are arranged over the two adjacent first cell strings 380a. As described above, the two adjacent first cell strings 380a are symmetrical in the word-line direction as well as in the bit-line direction. The two adjacent second cell strings 380b are symmetrical in the word-line direction as well as in the bit-line direction. Thus, the bit-line contact plugs 320 are coupled to drain regions of string selection transistors SST in the two adjacent first cell strings 380a, and to drain regions of string selection transistors SST in the two adjacent second cell strings 380b. The drain regions of the string selection transistors SST in the two adjacent first cell strings 380a and the two adjacent second cell strings 380b may be highly n-type doped (e.g., N+ doping).

The common source line contact plugs 360 couple the common source line to the two adjacent first cell strings 380a that are arranged in series in the bit-line direction, and to the two adjacent second cell strings 380b that are arranged over the two adjacent first cell strings 380a. As described above, the two adjacent first cell strings 380a are symmetrical in the word-line direction as well as in the bit-line direction. The two adjacent second cell strings 380b are symmetrical in the word-line direction as well as in the bit-line direction. Thus, the common source line contact plugs 360 are coupled to source regions of ground selection transistors GST in the two adjacent first cell strings 380a, and to source regions of ground selection transistors GST in the two adjacent second cell strings 380b. The source regions of the ground selection transistors GST in the two adjacent first cell strings 380a and the two adjacent second cell strings 380b may be highly n-type doped (e.g., N+ doping).

The pocket p-well contact plugs 340 couple the pocket p-well line to the first semiconductor layer SL1, and to the second semiconductor layer SL2. The pocket p-well contact plugs 340 are formed instead of at least one bit-line contact plugs 320 at corresponding positions of the layout defined by bit-line contact plugs 320. In other words, referring to FIG. 3, it can be seen that the bit-line contact plugs 320 are arranged to define a bit-line contact plug layout pattern, and that the pocket p-well contact plugs 340 are located in this layout pattern at positions that would otherwise be occupied by the bit-line contact plugs 320. Thus, the pocket p-well contact plugs 340 are arranged between the bit-line contact plugs 320. The pocket p-well contact plugs 340 are formed by a same process as the bit-line contact plugs 320. In addition, the pocket p-well contact plugs 340 are coupled to drain regions of string selection transistors SST in the two adjacent first cell strings 380a, and to drain regions of string selection transistors SST in the two adjacent second cell strings 380b because the pocket p-well contact plugs 340 are formed instead of at least one bit-line contact plugs 320 at the corresponding positions of the layout defined by the bit-line contact plugs 320. The drain regions of the string selection transistors SST in the two adjacent first cell strings 380a and the two adjacent second cell strings 380b may be highly p-type doped (e.g., P+ doping). Here, the two adjacent first cell strings 380a and the two adjacent second cell strings 380b coupled to the pocket p-well contact plugs 340 are dummy cell strings. In this example, the dummy cell strings are not coupled to the bit-lines via the bit-line contact plugs 320 and thus are not used to store data.

The semiconductor memory device having the stack array structure 300 of FIG. 3 allows for a relatively small layout overhead and a relatively high degree of integration since spare space is not needed for providing pocket p-well contacts. In addition, a relatively simple fabrication process may be utilized since the pocket p-well contact plugs 340 can be formed by the same process as the bit-line contact plugs 320 in the stack array structure 300.

FIG. 4 is a cross-sectional view of the stack array structure of FIG. 3 taken along line A-A' of FIG. 3.

Referring to the example of FIG. 4, the bit-line contact plugs 320 couple the bit-line BL to the two adjacent first cell strings 380a that are arranged in series in the bit-line direction, and to the two adjacent second cell strings 380b that are arranged over the two adjacent first cell strings 380a. Also in this example, the common source line contact plugs 360 couple the common source line CSL to the two adjacent first cell strings 380*a* that are arranged in series in the bit-line direction, and to the two adjacent second cell strings 380*b* that are arranged over the two adjacent first cell strings 380*a*.

In one example embodiment, the bit-line contact plugs 320 are coupled to drain regions of string selection transistors SST in the two adjacent first cell strings 380*a*, and to drain regions of string selection transistors SST in the two adjacent second cell strings 380*b*. The drain regions of the string selection transistors SST in the two adjacent first cell strings 380*a* and the two adjacent second cell strings 380*b* are highly n-type doped (e.g., N+ doping). In addition, the common source line contact plugs 360 are coupled to source regions of ground selection transistors GST in the two adjacent first cell strings 380*a*, and to source regions of ground selection transistors GST in the two adjacent second cell strings 380*b*. The source regions of the ground selection transistors GST in the two adjacent first cell strings 380*a* and the two adjacent second cell strings 380*b* are highly n-type doped (e.g., N+ doping).

FIG. 5 is a cross-sectional view of the stack array structure of FIG. 3 taken along line B-B' of FIG. 3.

Referring to the example of FIG. 5, the pocket p-well contact plugs 340 couple the pocket p-well line PPL to the two adjacent first cell strings 380*a* that are arranged in series in the bit-line direction, and to the two adjacent second cell strings 380*b* that are arranged over the two adjacent first cell strings 380*a*. That is, the pocket p-well contact plugs 340 couple the pocket p-well line PPL to the first semiconductor layer SL1, and to the second semiconductor layer SL2. Also in this example, the common source line contact plugs 360 may couple the common source line CSL to the two adjacent first cell strings 380*a* that are arranged in series in the bit-line direction, and to the two adjacent second cell strings 380*b* that are arranged over the two adjacent first cell strings 380*a*.

In one example embodiment, the pocket p-well contact plugs 340 are coupled to drain regions of string selection transistors SST in the two adjacent first cell strings 380*a*, and to drain regions of string selection transistors SST in the two adjacent second cell strings 380*b*. The drain regions of the string selection transistors SST in the two adjacent first cell strings 380*a* and the two adjacent second cell strings 380*b* are highly p-type doped (e.g., P+ doping). As described above, the pocket p-well contact plugs 340 are formed instead of at least one bit-line contact plugs 320 at the corresponding positions of the layout defined by the contact plugs 320.

Figure 6:
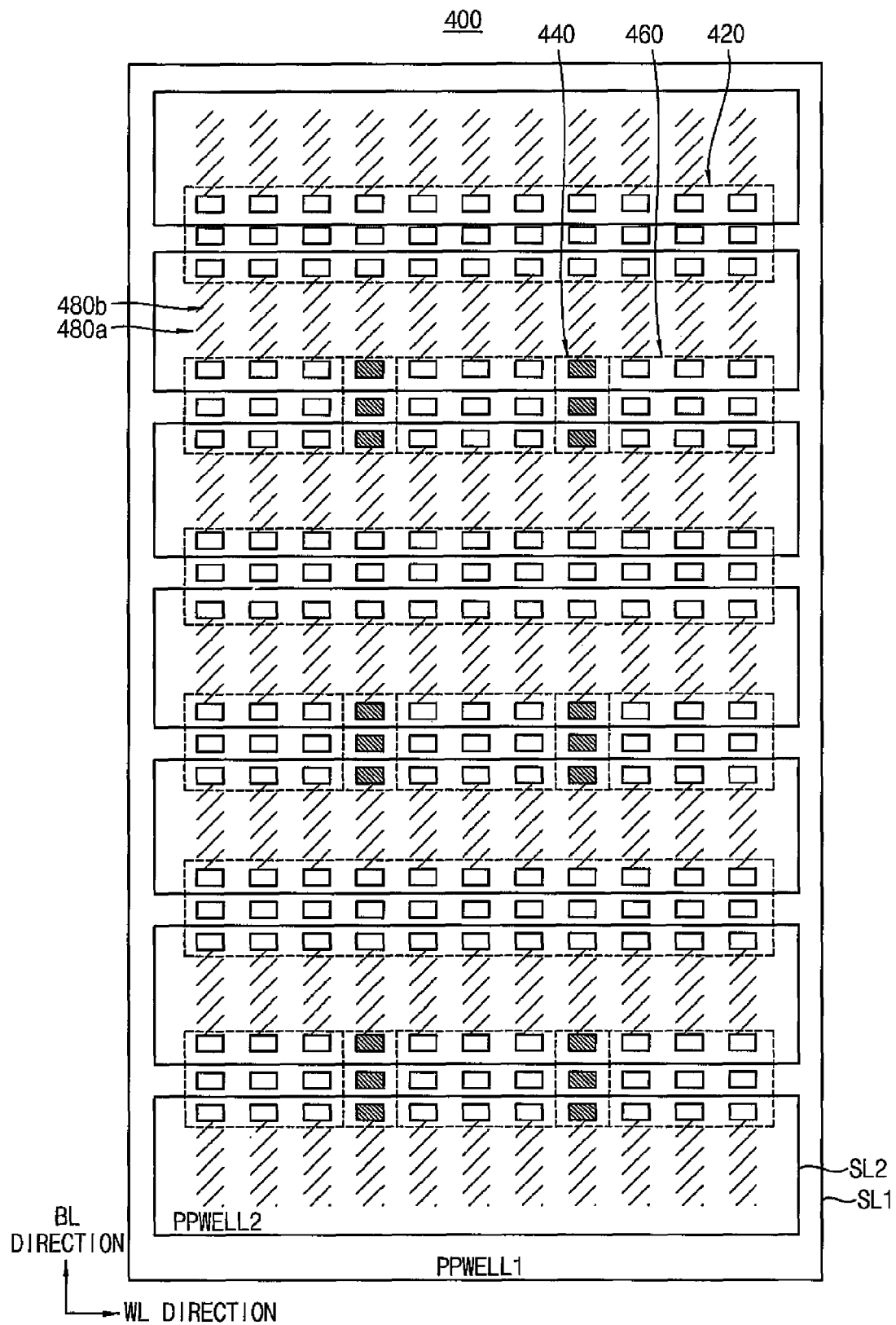
FIG. 6 is a diagram illustrating a stack array structure for a semiconductor memory device according to some example embodiments.

FIG. 6 is a diagram illustrating a stack array structure for a semiconductor memory device according to some example embodiments.

Referring to FIG. 6, the stack array structure 400 of this example includes a first semiconductor layer SL1, a second semiconductor layer SL2, a plurality of bit-line contact plugs 420, a plurality of common source line contact plugs 460, and a plurality of pocket p-well contact plugs 440.

The first semiconductor layer SL1 includes a plurality of first cell strings 480*a*. The first cell strings 480*a* are arranged in series in a bit-line direction, and in parallel in a word-line direction. Adjacent pairs of the first cell strings 380*a* are symmetrical to each other. The second semiconductor layer SL2 includes a plurality of second cell strings 480*b*. The second cell strings 480*b* are arranged in a same manner as the first cell strings 480*a*. That is, the second cell strings 480*b* are also arranged in series in the bit-line direction, and in parallel in the word-line direction. Adjacent pairs of the second cell strings 480*b* are also symmetrical to each other. The second semiconductor layer SL2 is placed over the first semiconductor layer SL1. In addition, the second cell strings 480*b* are placed over the first cell strings 480*a*.

The bit-line contact plugs 420 couple a bit-line to two adjacent first cell strings 480*a* that are arranged in series in the bit-line direction, and to two adjacent second cell strings 480*b* that are arranged over the two adjacent first cell strings 480*a*. The bit-line (not shown in FIG. 6) is placed over the second cell strings 480*b* in the bit-line direction. The common source line contact plugs 460 couple a common source line to two adjacent first cell strings 480*a* that are arranged in series in the bit-line direction, and to two adjacent second cell strings 480*b* that are arranged over the two adjacent first cell strings 480*a*. The common source line (not shown in FIG. 6) is placed over the second cell strings 480*b* in the word-line direction. The pocket p-well contact plugs 440 couple a pocket p-well line to the first semiconductor layer SL1, and to the second semiconductor layer SL2. The pocket p-well contact plugs 440 are formed instead of at least one common source line contact 460 at corresponding positions of the layout defined common source line contact plugs 460. In other words, referring to FIG. 6, it can be seen that the source line contact plugs 460 are arranged to define a source line contact plug layout pattern, and that the pocket p-well contact plugs 440 are located in this layout pattern at positions that would otherwise be occupied by the source line contact plugs 460. The pocket p-well line (not shown in FIG. 6) is placed over the second cell strings 480*b* in the bit-line direction. However, the direction in which the pocket p-well line is placed over the second cell strings 480*b* in not limited thereto.

The bit-line contact plugs 420 couple the bit-line to the two adjacent first cell strings 480*a* that are arranged in series in the bit-line direction, and to the two adjacent second cell strings 480*b* that are arranged over the two adjacent first cell strings 480*a*. As described above, the adjacent pairs of the first cell strings 480*a* are symmetrical in the word-line direction as well as in the bit-line direction. The adjacent pairs of the second cell strings 480*b* are symmetrical in the word-line direction as well as in the bit-line direction. For example, adjacent pairs of the first cell strings 480*a* arranged in parallel are symmetrical to each other, and adjacent pairs of the first cell strings 480*a* arranged in series are also symmetrical to each other. Similarly, adjacent pairs of the second cell strings 480*b* arranged in parallel are symmetrical to each other, and adjacent pairs of the second cell strings 480*b* arranged in series are also symmetrical to each other. The bit-line contact plugs 420 are coupled to drain regions of string selection transistors SST in the two adjacent first cell strings 480*a*, and to drain regions of string selection transistors SST in the two adjacent second cell strings 480*b*. The drain regions of the string selection transistors SST in the two adjacent first cell strings 480*a* and the two adjacent second cell strings 480*b* may be highly n-type doped (e.g., N+ doping).

The common source line contact plugs 460 couple the common source line to the two adjacent first cell strings 480*a* that are arranged in series in the bit-line direction, and to the two adjacent second cell strings 480*b* that are arranged over the two adjacent first cell strings 480*a*. As described above, the adjacent two of the first cell strings 480*a* are symmetrical in the word-line direction as well as in the bit-line direction. The adjacent pair of the second cell strings 480*b* are symmetrical in the word-line direction as well as in the bit-line direction. Thus, the common source line contact plugs 460 are coupled to source regions of ground selection transistors GST in the two adjacent first cell strings 480*a*, and to source regions of ground selection transistors GST in the two adjacent second cell strings 480*b*. The source regions of the ground selection transistors GST in the two adjacent first cell strings 480*a* and the two adjacent second cell strings 480*b* may be highly n-type doped (e.g., N+ doping).

The pocket p-well contact plugs 440 couple the pocket p-well line to the first semiconductor layer SL1, and to the second semiconductor layer SL2. As described above, the pocket p-well contact plugs 440 are formed instead of at least one common source line contact plugs 460 at the corresponding positions of the layout defined by the common source line contact plugs 460. Thus, the pocket p-well contact plugs 440 are arranged between the common source line contact plugs 460. The pocket p-well contact plugs 440 are formed by a same process as the common source line contact plugs 460. In addition, the pocket p-well contact plugs 440 are coupled to source regions of ground selection transistors GST in the two adjacent first cell strings 480a, and to source regions of ground selection transistors GST in the two adjacent second cell strings 480b because the pocket p-well contact plugs 440 are formed instead of at least one common source line contact plugs 460 at corresponding positions of the layout defined by the common source line contact plugs 460. The source regions of the ground selection transistors GST in the two adjacent first cell strings 480a and the two adjacent second cell strings 480b may be highly p-type doped (e.g., P+ doping). Here, the two adjacent first cell strings 480a and the two adjacent second cell strings 480b coupled to the pocket p-well contact plugs 440 are dummy cell strings. In this example, the dummy cell strings are not coupled to the bit-lines via the bit-line contact plugs 420 and thus are not used to store data.

The semiconductor memory device having the stack array structure 400 of FIG. 6 allows for a relatively small layout overhead and a relatively high degree of integration since spare space is not needed for providing pocket p-well contacts. In addition, a relatively simple fabrication process may be utilized since the pocket p-well contact plugs 440 can be formed by the same process as the common source line contact plugs 460 in the stack array structure 400.

Figure 7:
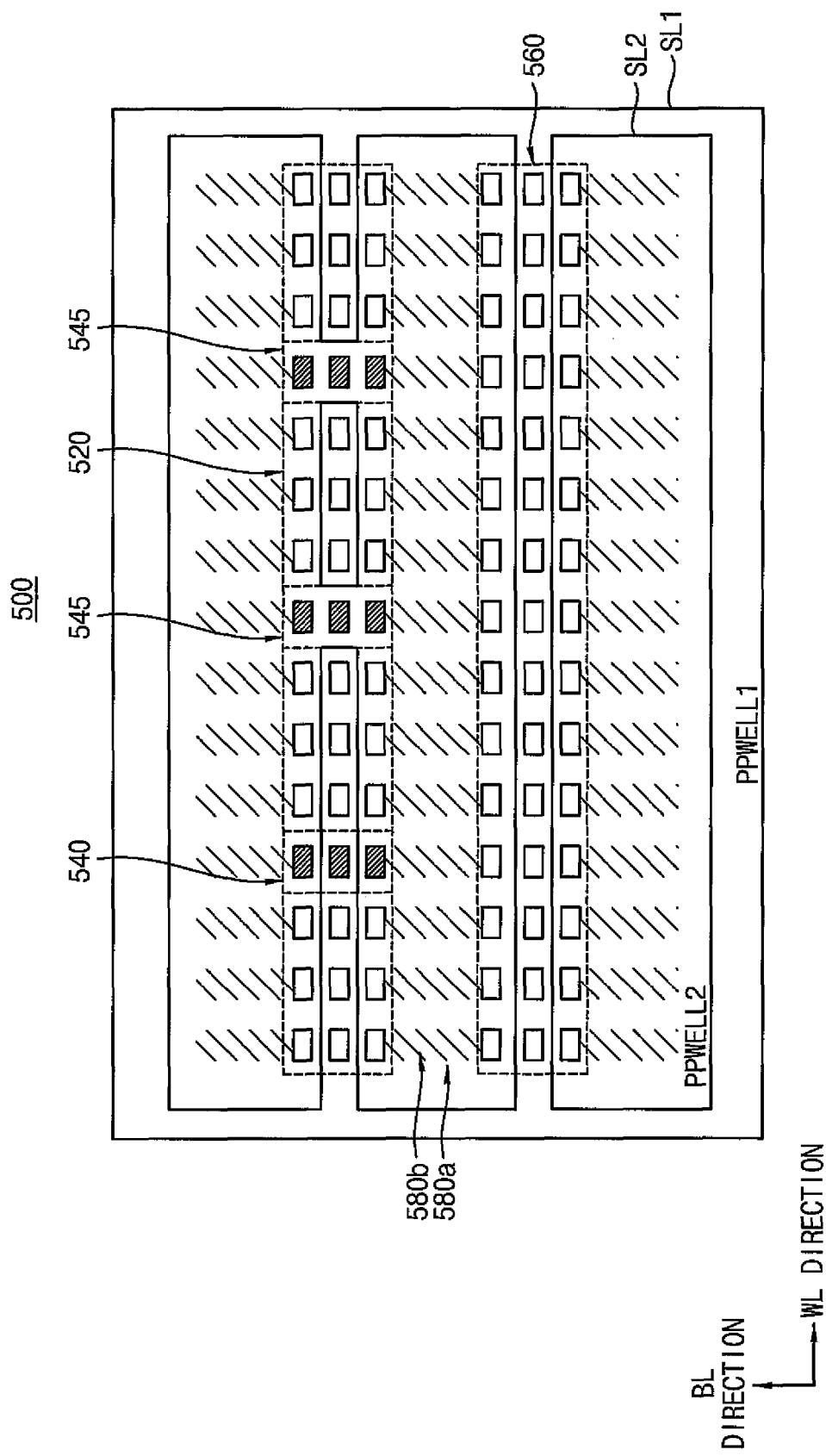
FIG. 7 is a diagram illustrating one example of a stack array structure when a pocket p-well sheet resistance of a first semiconductor layer is different than a pocket p-well sheet resistance of a second semiconductor layer.

FIG. 7 is a diagram illustrating one example of a stack array structure in a case where a pocket p-well sheet resistance of a first semiconductor layer is different from a pocket p-well sheet resistance of a second semiconductor layer.

Referring to FIG. 7, the stack array structure 500 of this example includes a first semiconductor layer SL1, a second semiconductor layer SL2, a plurality of bit-line contact plugs 520, a plurality of common source line contact plugs 560, a plurality of first pocket p-well contact plugs 540, and a plurality of second pocket p-well contact plugs 545.

The first semiconductor layer SL1 includes a plurality of first cell strings 580a. The first cell strings 580a are arranged in series in a bit-line direction, and in parallel in a word-line direction. Adjacent pairs of the first cell strings 580a are symmetrical to each other. The second semiconductor layer SL2 includes a plurality of second cell strings 580b. The second cell strings 580b are arranged in a same manner as the first cell strings 580a. That is, the second cell strings 580b are also arranged in series in the bit-line direction, and in parallel in the word-line direction. Adjacent pairs of the second cell strings 580b are also symmetrical to each other. The second semiconductor layer SL2 is placed over the first semiconductor layer SL1. In addition, the second cell strings 580b are placed over the first cell strings 580a as illustrated.

The bit-line contact plugs 520 couple a bit-line to two adjacent first cell strings 580a that are arranged in series in the bit-line direction, and to two adjacent second cell strings 580b that are arranged over the two adjacent first cell strings 580a. The bit-line (not shown in FIG. 7) is placed over the second cell strings 580b in the bit-line direction. The common source line contact plugs 560 couple a common source line to two adjacent first cell strings 580a that are arranged in series in the bit-line direction, and to two adjacent second cell strings 580b that are arranged over the two adjacent first cell strings 580a. The common source line (not shown in FIG. 7) is placed over the second cell strings 580b in the word-line direction. The first pocket p-well contact plugs 540 couple a pocket p-well line to the first semiconductor layer SL1, and to the second semiconductor layer SL2. The first pocket p-well contact plugs 540 are formed instead of at least one bit-line contact plugs 520 at corresponding positions of the layout defined by the bit-line contact plugs 520. The second pocket p-well contact plugs 545 couple the pocket p-well line only to the first semiconductor layer SL1, or only to the second semiconductor layer SL2. The second pocket p-well contact plugs 545 are also formed instead of at least one bit-line contact plugs 520 at corresponding positions of the layout defined by the bit-line contact plugs 520. The pocket p-well line (not shown in FIG. 7) is placed over the second cell strings 580b in the bit-line direction. However, the direction in which the pocket p-well line is placed over the second cell strings 580b in not limited thereto.

Generally, resistances of a first pocket p-well region PPWELL1 and a second pocket p-well region PPWELL2 may be reduced when a pocket p-well strapping is applied to the first pocket p-well region PPWELL1 and the second pocket p-well region PPWELL2. Thus, the number of pocket p-well contacts for the first semiconductor layer SL1 and the second semiconductor layer SL2 may be determined based on pocket p-well sheet resistances of the first semiconductor layer SL1 and the second semiconductor layer SL2, respectively. In the stack array structure 500, the number of the pocket p-well contacts for the first semiconductor layer SL1 and the second semiconductor layer SL2 may be determined by using the first pocket p-well contact plugs 540 and the second pocket p-well contact plugs 545 when the pocket p-well sheet resistance of the first semiconductor layer SL1 is different from the pocket p-well sheet resistance of the second semiconductor layer SL2. For example, the second pocket p-well contact plugs 545 that couples the pocket p-well line only to the second semiconductor layer SL2 may be used when the pocket p-well sheet resistance of the second semiconductor layer SL2 is greater than the pocket p-well sheet resistance of the first semiconductor layer SL1 as illustrated in FIG. 7.

Figure 8:
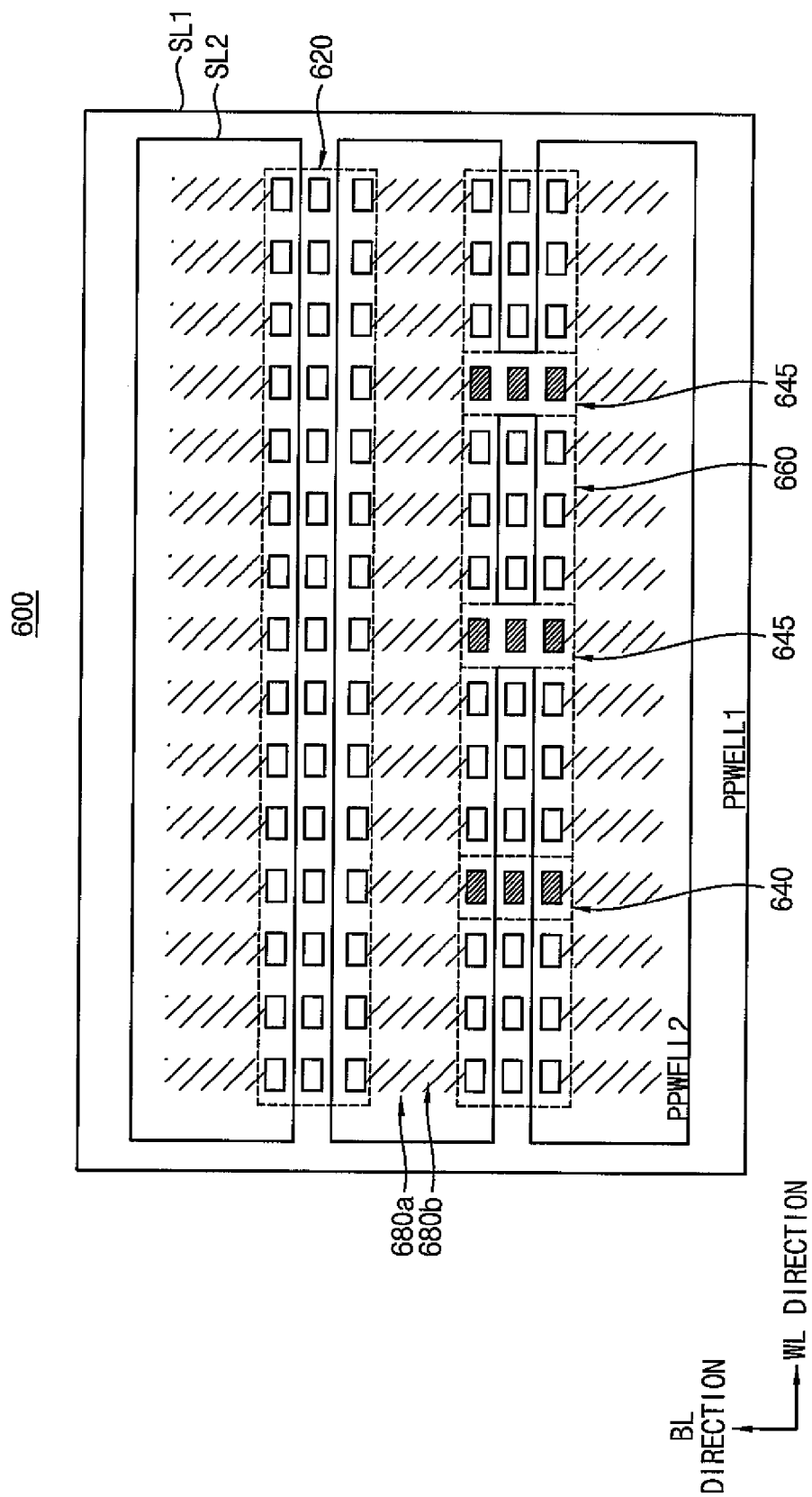
FIG. 8 is a diagram illustrating another example of a stack array structure when a pocket p-well sheet resistance of a first semiconductor layer is different than a pocket p-well sheet resistance of a second semiconductor layer.

FIG. 8 is a diagram illustrating another example of a stack array structure in a case where a pocket p-well sheet resistance of a first semiconductor layer is different from a pocket p-well sheet resistance of a second semiconductor layer.

Referring to FIG. 8, the stack array structure 600 of this example includes a first semiconductor layer SL1, a second semiconductor layer SL2, a plurality of bit-line contact plugs 620, a plurality of common source line contact plugs 660, a plurality of first pocket p-well contact plugs 640, and a plurality of second pocket p-well contact plugs 645.

The first semiconductor layer SL1 includes a plurality of first cell strings 680a. The first cell strings 680a are arranged in series in a bit-line direction, and in parallel in a word-line direction. Adjacent pairs of the first cell strings 680a are symmetrical to each other. The second semiconductor layer SL2 includes a plurality of second cell strings 680b. The second cell strings 680b are arranged in a same manner as the first cell strings 680a. That is, the second cell strings 680b are also arranged in series in the bit-line direction, and in parallel in the word-line direction. Adjacent pairs of the second cell strings 680b are also symmetrical to each other. The second semiconductor layer SL2 is placed over the first semiconductor layer SL1. In addition, the second cell strings 680b are placed over the first cell strings 680a.

The bit-line contact plugs 620 couple a bit-line to two adjacent first cell strings 680a that are arranged in series in the bit-line direction, and to two adjacent second cell strings 680b that are arranged over the two adjacent first cell strings 680a. The bit-line (not shown in FIG. 8) is placed over the second cell strings 680b in the bit-line direction. The common source line contact plugs 660 couples a common source line to two adjacent first cell strings 680a that are arranged in series in the bit-line direction, and to two adjacent second cell strings 680b that are arranged over the two adjacent first cell strings 680a. The common source line (not shown in FIG. 8) is placed over the second cell strings 680b in the word-line direction. The first pocket p-well contact plugs 640 couple a pocket p-well line to the first semiconductor layer SL1, and to the second semiconductor layer SL2. The first pocket p-well contact plugs 640 are formed instead of at least one common source line contact plugs 660 at corresponding positions of the layout defined by the common source line contact plugs 660. The second pocket p-well contact plugs 645 couple the pocket p-well line only to the first semiconductor layer SL1, or only to the second semiconductor layer SL2. The second pocket p-well contact plugs 645 are also formed instead of at least one common source line contact plugs 660 at corresponding positions of the layout defined by the common source line contact plugs 660. The pocket p-well line (not shown in FIG. 8) is placed over the second cell strings 680b in the bit-line direction. However, the direction in which the pocket p-well line is placed over the second cell strings 680b in not limited thereto.

As described above, resistances of a first pocket p-well region PPWELL1 and a second pocket p-well region PPWELL2 may be reduced when a pocket p-well strapping is applied to the first pocket p-well region PPWELL1 and the second pocket p-well region PPWELL2. Thus, the number of pocket p-well contacts for the first semiconductor layer SL1 and the second semiconductor layer SL2 may be determined based on pocket p-well sheet resistances of the first semiconductor layer SL1 and the second semiconductor layer SL2, respectively. In the stack array structure 600, the number of the pocket p-well contacts for the first semiconductor layer SL1 and the second semiconductor layer SL2 may be determined by using the first pocket p-well contact plugs 640 and the second pocket p-well contact plugs 645 when the pocket p-well sheet resistance of the first semiconductor layer SL1 is different from the pocket p-well sheet resistance of the second semiconductor layer SL2. For example, the second pocket p-well contact plugs 645 that couples the pocket p-well line only to the second semiconductor layer SL2 may be used when the pocket p-well sheet resistance of the second semiconductor layer SL2 is greater than the pocket p-well sheet resistance of the first semiconductor layer SL1 as illustrated in FIG. 8.

Figure 9:
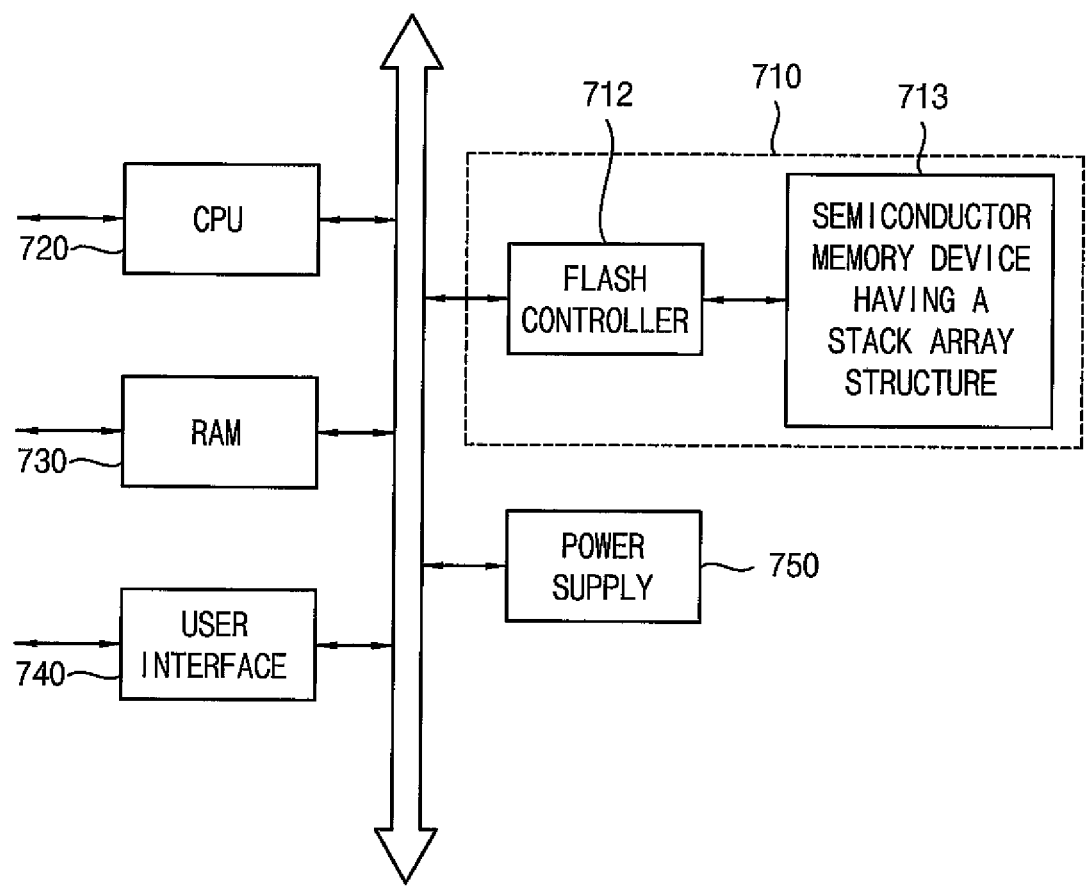
FIG. 9 is a block diagram illustrating a system that includes a semiconductor memory device having a stack array structure according to some example embodiments.

FIG. 9 is a block diagram illustrating a system that includes a semiconductor memory device having a stack array structure according to one or more of the example embodiments described above.

Referring to FIG. 9, the system 700 may include a flash memory unit 710, a central processing unit 720, a random access memory unit 730, a user interface unit 740, and a power supply unit 750. The flash memory unit 710 may include a flash memory controller 712, and a semiconductor memory device 713 having a stack array structure according to some example embodiments. The flash memory unit 710 may be implemented as a memory card device, a solid state drive/disk (SSD), and etc. The flash memory unit 710 may be electrically coupled to the central processing unit 720, the random access memory unit 730, the user interface unit 740, and the power supply unit 750. The system 700 may further include an application chipset, a camera image processor (CIS), a mobile dynamical random access memory (MDRAM), and etc according to applications or purposes.

The semiconductor memory device 713 having the stack array structure according to one or more of the example embodiments may be mounted on chip using various packages such as Package on Package (POP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline Package (TSOP), System In Package (SW), Multi Chip Package (MCP), Wafer-level Fabricated Package (WFP), Wafer-Level Processed Stack Package (WSP), and so on. In addition, the semiconductor memory device 713 having the stack array structure according to one or more of the example embodiments may be included in a memory card device. In this case, the semiconductor memory device may communicate with external devices (e.g., host device) using various interface protocols such as Universal Serial Bus (USB), Multi-Media Card (MMC), PCI-E, Serial Advanced Technology Attachment (SATA), Parallel Advanced Technology Attachment (PATA), Small Computer System Interface (SCSI), Enhanced Small Disk Interface (ESDI), Integrated Drive Electronics (IDE), and an so on.

As described above, a stack array structure according to some example embodiments allows for efficient contacts for a pocket p-well strapping to decrease a layout overhead of a semiconductor memory device. Thus, a semiconductor memory device having a stack array structure according to some example embodiments may be manufactured in a high degree of integration by a simple process. Accordingly, a stack array structure according to some example embodiments may be employed in a semiconductor memory device such as a NAND flash memory device, a NOR flash memory device, and so on. In addition, a semiconductor memory device having a stack array structure according to some example embodiments may be applied to a laptop computer, a personal computer, a digital TV, a digital camera, a PDA (personal digital assistants), a PMP (portable multimedia player), MP3P (MPEG Audio Layer-3 player), and so on.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A stack array structure for a semiconductor memory device, comprising:
 a first semiconductor layer including a plurality of first cell strings which include first cell strings extending parallel to one another in a word-line direction and first cell strings aligned in series in a bit-line direction;

a second semiconductor layer including a plurality of second cell strings which include second cell strings extending parallel to one another in a word-line direction and second cell strings aligned in series in a bit-line direction, and wherein the second semiconductor layer is located over the first semiconductor layer such that the second cell strings are located over the first cell strings;

a plurality of bit-line contact plugs configured to couple a bit-line to two adjacent first cell strings aligned in series in the bit-line direction, and to further couple the bit-line to two adjacent second cell strings respectively located over the two adjacent first cell strings, wherein the bit-line contact plugs are arranged to define a bit-line plug layout over the plurality of first cells strings and the plurality of second cell strings;

a plurality of common source line contact plugs configured to couple a common source line to the two adjacent first cell strings and the two adjacent second cell strings; and a plurality of pocket p-well contact plugs configured to couple a pocket p-well line to the first semiconductor layer and the second semiconductor layer, the pocket p-well contact plugs being located at positions corresponding to the bit-line plug layout.

2. The stack array structure of claim 1, wherein the two adjacent first cell strings are symmetrical to each other, and the two adjacent second cell strings are symmetrical to each other.

3. The stack array structure of claim 1, wherein the pocket p-well contact plugs are formed by a same process as the bit-line contact plugs.

4. The stack array structure of claim 1, wherein the pocket p-well contact plugs are coupled to drain regions of string selection transistors in the two adjacent first cell strings, and to drain regions of string selection transistors in the two adjacent second cell strings, and wherein the drain regions of the string selection transistors are p-type doped.

5. The stack array structure of claim 1, wherein the two adjacent first cell strings and the two adjacent second cell strings coupled to the pocket p-well contact plugs are dummy cell strings.

6. The stack array structure of claim 1, wherein the bit-line contact plugs are coupled to drain regions of string selection transistors in the two adjacent first cell strings, and to drain regions of string selection transistors in the two adjacent second cell strings, and wherein the drain regions of the string selection transistors are n-type doped.

7. The stack array structure of claim 1, wherein the common source line contact plugs are coupled to source regions of ground selection transistors in the two adjacent first cell strings, and to source regions of ground selection transistors in the two adjacent second cell strings, and wherein the source regions of the ground selection transistors are n-type doped.

8. The stack array structure of claim 1, wherein pocket p-well sheet resistance of the first semiconductor layer is different from a pocket p-well sheet resistance of the second semiconductor layer, and wherein at least one of the pocket p-well contact plugs couple the pocket p-well line to only one of the first semiconductor layer and the second semiconductor layer.

9. A stack array structure for a semiconductor memory device, comprising:

a first semiconductor layer including a plurality of first cell strings which include first cell strings extending parallel to one another in a word-line direction and first cell strings aligned in series in a bit-line direction;

a second semiconductor layer including a plurality of second cell strings which include second cell strings extending parallel to one another in a word-line direction and second cell strings aligned in series in a bit-line direction, and wherein the second semiconductor layer is located over the first semiconductor layer such that the second cell strings are located over the first cell strings;

a plurality of bit-line contact plugs configured to couple a bit-line to two adjacent first cell strings aligned in series in the bit-line direction, and to further couple the bit-line to two adjacent second cell strings respectively located over the two adjacent first cell strings;

a plurality of common source line contact plugs configured to couple a common source line to the two adjacent first cell strings and the two adjacent second cell strings, wherein the common source line contact plugs are arranged to define a common source line contact plug layout over the plurality of first cells strings and the plurality of second cell strings; and a plurality of pocket p-well contact plugs configured to couple a pocket p-well line to the first semiconductor layer and the second semiconductor layer, the pocket p-well contact plugs being located at positions corresponding to the common source line contact plug layout.

10. The stack array structure of claim 9, wherein the two adjacent first cell strings are symmetrical to each other, and the two adjacent second cell strings are symmetrical to each other.

11. The stack array structure of claim 9, wherein the pocket p-well contact plugs are formed by a same process as the common source line contact plugs.

12. The stack array structure of claim 9, wherein the pocket p-well contact plugs are coupled to source regions of ground selection transistors in the two adjacent first cell strings, and to source regions of ground selection transistors in the two adjacent second cell strings, and wherein the source regions of the ground selection transistors are p-type doped.

13. The stack array structure of claim 12, wherein the two adjacent first cell strings and the two adjacent second cell strings coupled to the pocket p-well contact plugs are dummy cell strings.

14. The stack array structure of claim 9, wherein the bit-line contact plugs are coupled to drain regions of string selection transistors in the two adjacent first cell strings, and to drain regions of string selection transistors in the two adjacent second cell strings, and wherein the drain regions of the string selection transistors are n-type doped.

15. The stack array structure of claim 9, wherein the common source line contact plugs are coupled to source regions of ground selection transistors in the two adjacent first cell strings, and to source regions of ground selection transistors in the two adjacent second cell strings, and wherein the source regions of the ground selection transistors are n-type doped.

16. The stack array structure of claim 9, wherein a pocket p-well sheet resistance of the first semiconductor layer is different from a pocket p-well sheet resistance of the second semiconductor layer, and wherein at least one of the pocket p-well contact plugs couple the pocket p-well line to only one of the first semiconductor layer and the second semiconductor layer.

* * * * *